(12) United States Patent
Aikala et al.

(10) Patent No.: US 9,450,144 B2
(45) Date of Patent: Sep. 20, 2016

(54) PLANT ILLUMINATION DEVICE AND METHOD

(75) Inventors: Lars Aikala, Lapinkyla (FI); Ilkka Kivimaki, Helsinki (FI)

(73) Assignee: VALOYA OY, Helsinki (FI)

( * ) Notice: Subject to any disclaimer, the term of this patent is extended or adjusted under 35 U.S.C. 154(b) by 363 days.

(21) Appl. No.: 13/695,483

(22) PCT Filed: Feb. 8, 2012

(86) PCT No.: PCT/FI2012/050118
§ 371 (c)(1),
(2), (4) Date: Oct. 31, 2012

(87) PCT Pub. No.: WO2012/123627
PCT Pub. Date: Sep. 20, 2012

(65) Prior Publication Data
US 2013/0042527 A1  Feb. 21, 2013

Related U.S. Application Data

(60) Provisional application No. 61/468,831, filed on Mar. 29, 2011.

(30) Foreign Application Priority Data

Mar. 17, 2011  (EP) ..................................... 11158693

(51) Int. Cl.
*A01G 7/04* (2006.01)
*H01L 33/06* (2010.01)

(52) U.S. Cl.
CPC .............. *H01L 33/06* (2013.01); *A01G 7/045* (2013.01)

(58) Field of Classification Search
CPC ....... H01L 33/04; H01L 33/06; A01G 7/045; Y10S 362/805; Y10S 47/06

USPC ....... 47/58.1 LS, 58.1 R, DIG. 6, 17, 1.01 R; 257/14, 39, E33.008; 977/774

See application file for complete search history.

(56) References Cited

U.S. PATENT DOCUMENTS 6,890,777 B2 * 5/2005 Bawendi et al. ............... 438/22
8,008,672 B2 * 8/2011 Moon et al. ................... 257/79
(Continued)

FOREIGN PATENT DOCUMENTS

WO  99/50916 A1  10/1999
WO  2009/014707 A2  1/2009
(Continued)

OTHER PUBLICATIONS

European Search Report, dated Aug. 29, 2011, from corresponding European application.
(Continued)

*Primary Examiner* — Trinh Nguyen
(74) *Attorney, Agent, or Firm* — Young & Thompson

(57) ABSTRACT

An improved method to produce artificial light for plant cultivation, an illumination device with a semiconductor light emission solution and device suited for plant cultivation in a greenhouse environment are described. The best mode is considered to be a lighting device with binary alloy quantum dots (110, 120, 130, 140, 150, 160) made by colloidal methods to produce a size distribution of quantum dots that produces an emission spectrum similar to the photosynthetically active radiation (PAR) spectrum. The methods and arrangements allow more precise spectral tuning of the emission spectrum for lights used in plant (310, 311) cultivation. Therefore unexpected improvements in the photomorphogenetic control of plant growth, and further improvements in plant production are realized.

18 Claims, 6 Drawing Sheets

(56) References Cited

U.S. PATENT DOCUMENTS

| | | | |
|---|---|---|---|
| 8,436,334 B2* | 5/2013 | Soh et al. ........................ | 257/13 |
| 2004/0259363 A1* | 12/2004 | Bawendi et al. ............. | 438/689 |
| 2007/0085092 A1* | 4/2007 | Chen ............................... | 257/89 |
| 2010/0051898 A1* | 3/2010 | Kim et al. ........................ | 257/9 |
| 2010/0259190 A1* | 10/2010 | Aikala .......................... | 315/294 |
| 2012/0124903 A1* | 5/2012 | Takeuchi ................. | 47/58.1 LS |
| 2013/0283683 A1* | 10/2013 | Ringbom et al. ........ | 47/58.1 LS |
| 2014/0250778 A1* | 9/2014 | Suntych ........................... | 47/1.4 |
| 2014/0268635 A1* | 9/2014 | Aikala et al. ................... | 362/84 |
| 2014/0366439 A1* | 12/2014 | Ben-Dayan et al. .... | 47/58.1 LS |

FOREIGN PATENT DOCUMENTS

| | | |
|---|---|---|
| WO | 2009/048425 A1 | 4/2009 |
| WO | 2009/123763 A2 | 10/2009 |
| WO | 2010/053341 A1 | 5/2010 |

OTHER PUBLICATIONS

International Search Report, dated May 3, 2012, from corresponding PCT application.

Gioia D. Massa et al., "Plant Productivity in Response to LED Lighting", HortScience, Dec. 2008, pp. 1951-1956, vol. 43, No. 7; Cited in International Search Report.

* cited by examiner

PLANT ILLUMINATION DEVICE AND METHOD

TECHNICAL FIELD OF INVENTION

The invention relates to an improved method to produce artificial light for plant cultivation. In more particular, the invention relates to an illumination device with a semiconductor light emission solution suited for plant cultivation in a greenhouse environment.

BACKGROUND

Only approximately 50% of the radiation reaching the surface is photosynthetically active radiation (PAR). PAR is construed to comprise the wavelength region between 300 nm and 800 nm of the electromagnetic spectrum. Photosynthesis together with photoperiodism, phototropism and photomorphogenesis are the four representative processes related to interaction between radiation and plants. The following expression shows the simplified chemical equation of photosynthesis:

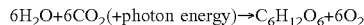

$$6H_2O+6CO_2(+\text{photon energy})\rightarrow C_6H_{12}O_6+6O_2$$

The typical absorption spectra of the most common photosynthetic and photo-morphogenetic photoreceptors, such as chlorophyll a, chlorophyll b and betacarotene, and the two interconvertable forms of phytochromes (Pfr and Pr) are presented in FIG. 1A.

The photomorphogenetic responses, contrary to photosynthesis, can be achieved with extremely low light quantities. The different types of photosynthetic and photo-morphogenetic photoreceptors can be grouped in at least three known photosystems: photosynthetic, phytochrome and cryptochrome or blue/UV-A (ultraviolet-A).

In the photosynthetic photosystem, the existing pigments are chlorophylls and carotenoids. Chlorophylls are located in the chloroplasts' thylakoids located in the leaf mesophyll cells of plants. The quantity or the energy of the radiation is the most significant aspect, since the activity of those pigments is closely related to the light harvest. The two most important absorption peaks of chlorophyll are located in the red and blue regions from 625 to 675 nm and from 425 to 475 nm, respectively. Additionally, there are also other localized peaks at near-UV (300-400 nm) and in the far-red region (700-800 nm). Carotenoids such as xanthophylls and carotenes are located in the chromoplast plastid organelles on plant cells and absorb mainly in the blue region.

The phytochrome photosystem includes the two interconvertable forms of phytochromes, Pr and Pfr, which have their sensitivity peaks in the red at 660 nm and in the far-red at 730 nm, respectively. Photomorphogenetic responses mediated by phytochromes are usually related to the sensing of the light quality through the red (R) to far-red (FR) ratio (R/FR). The importance of phytochromes can be evaluated by the different physiological responses where they are involved, such as leaf expansion, neighbour perception, shade avoidance, stem elongation, seed germination and flowering induction. Although shade-avoidance response is usually controlled by phytochromes through the sensing of R/FR ratio, the blue-light and PAR level is also involved in the related adaptive morphological responses.

Blue- and UV-A (ultraviolet A)-sensitive photoreceptors are found in the cryptochrome photosystem. Blue light absorbing pigments include both cryptochrome and phototropins. They are involved in several different tasks, such as monitoring the quality, quantity, direction and periodicity of the light. The different groups of blue- and UV-A-sensitive photoreceptors mediate important morphological responses such as endogenous rhythms, organ orientation, stem elongation and stomatal opening, germination, leaf expansion, root growth and phototropism. Phototropins regulate the pigment content and the positioning of photosynthetic organs and organelles in order to optimize the light harvest and photoinhibition. As with exposure to continuous far-red radiation, blue light also promotes flowering through the mediation of cryptochromes photoreceptors. Moreover, blue-light-sensitive photoreceptors (e.g. flavins and carotenoids) are also sensitive to the near-ultraviolet radiation, where a localized sensitivity peak can be found at around 370 nm.

Cryptochromes are not only common to all plant species. Cryptochromes mediate a variety of light responses, including the entrainment of the circadian rhythms in flowering plants such as the Arabidopsis. Although radiation of wavelengths below 300 nm can be highly harmful to the chemical bonds of molecules and to DNA structure, plants absorb radiation in this region also. The quality of radiation within the PAR region may be important to reduce the destructive effects of UV radiation. These photoreceptors are the most investigated and therefore their role in control of photosynthesis and growth is known reasonably well. However, there is evidence of the existence of other photoreceptors, the activity of which may have an important role in mediating important physiological responses in plants. Additionally, the interaction and the nature of interdependence between certain groups of receptors are not well understood.

Many plants can be grown in a different geographical location to their natural habitat by means of greenhouse cultivation utilising artificial light. It is known from WO 2010/053341 A1 by Zukauskas et al. that light emitting diodes (LEDs) can be used with phosphor conversion to satisfy some of the photomorphogenetic needs of plants. Phosphor conversion operates so that there is a light such as an LED that emits at a short wavelength adjacent to a phosphor component that absorbs and re-emits the radiation at a longer wavelength. This way the aggregate emission spectrum of the lighting device can be tuned, so that the photons provided to the plant allow the plant to grow in a certain way, e.g. to meet some morphological objectives such as stem height. This document is cited here as reference.

Light emitting diodes (LEDs) are increasing in popularity every day. A peculiar new structure used for LEDs is the quantum dot that is a semiconductor whose excitons are confined in all three spatial dimensions. Quantum dots have been suggested to be used to get rid of phosphor in WO 2009/048425 that discusses a multiple quantum well structure (MQW) comprising quantum dots. According to this publication, the MQW structure can be used to produce a phosphor free red and white nitride based LED. This document is also cited here as reference.

The prior art has considerable disadvantages. The prior art fluorescence tubes, LEDs and phosphor arrangements do not allow sufficiently high resolution tuning of the emission spectra. Furthermore the prior art fluorescence tubes, LEDs and phosphor arrangements are very poor as the primary source of light for the plants, yielding poor quality harvests in dark growth cavities, such as basements of buildings etc.

The prior art MQW and quantum dot illumination devices are mainly focused on replacement of disadvantageous architectural features (such as phosphorus), which is of little help to a horticulturalist.

Quite clearly more sophisticated plant cultivation technologies are needed to combat global hunger in the developing countries, as well as to reduce the environmental impact of food and plant production in the developed world.

SUMMARY

The invention under study is directed towards a system and a method for effectively realising a quantum confined semiconductor illumination device that addresses the photomorphogenetic needs of plants with better precision than ever before.

In one aspect of the invention the quantum confinement is realised as a quantum dot, i.e. confinement in all 3-spatial dimensions, or indeed as a plurality of quantum dots. Besides using quantum dots, quantum wires (2-D spatial confinement) and quantum wells (1-D spatial confinement) can be used to implement the invention in some embodiments, for example by replacing one or more quantum dots from said embodiments.

According to one aspect of the invention, a quantum dot—light emitting diode features quantum dots of different sizes. In quantum dots the size inversely correlates with the emission energy, i.e. smaller quantum dots emit higher energies. In one aspect of the invention the size distribution of quantum dots is selected so that it produces an aggregate emission spectrum with favourable photomorphogenic effects for the plants that are being cultivated with the artificial light emitted by said quantum dot—light emitting diode of the invention.

It is an aim of the present invention to eliminate at least a part of the problems relating to the art and to provide a new way of facilitating plant growth using quantum dots.

It is a first objective of the invention to provide a single light emission source based quantum dot device to which the photosynthesis process responds well.

It is a second objective of the invention to provide a lighting fixture for greenhouse cultivation based on a photosynthesis photon flux (PPF) optimized quantum dot device.

It is a third objective of the invention to achieve a quantum dot device that provides at least two emission peaks in the wavelength range from 300 to 800 nm and at least one of the emission peaks has Full width at half maximum (FWHM) of at least 50 nm or more.

It is a fourth objective of the invention to provide a quantum dot based greenhouse cultivation lighting fixture wherein the emission intensity ratio of two emission frequencies, 300-500 nm and 600-800 nm, are reduced with less than 20% during the 10,000 hours of operation.

It is a fifth objective of the invention to provide a technical solution giving a better PPF value per Watt (i.e. PPFs against used power wattage) than attained by a conventional high pressure sodium or LED lamp normally used in greenhouse cultivation and thus providing an energy efficient light source for greenhouse cultivation process and artificial lighting used therein.

It is a sixth objective of the invention to provide a single light emission source wherein the emission at a frequency of 300-500 nm is generated by the semiconductor quantum dot chip and the emission at a frequency of 600-800 nm is generated using another quantum dot chip. The inventor has discovered that for example cucumber and lettuce plants reach greater length and/or mass when illuminated with the inventive horticultural light that includes far red light (700-800 nm).

It is a seventh objective of the invention to provide a single light emission source where the emission at frequency of 300-500 nm is generated by the semiconductor quantum dot chip and the emission at frequency of 600-800 nm is generated using a second quantum dot chip, which is either driven by electric current for light emission, or operates as an wavelength up-converter of the earlier quantum dot. The wavelength up-conversion to produce 600-800 nm radiation is achieved by using one or more wavelength up-conversion quantum dots in proximity of the first quantum dot emission source.

In this application "up-conversion" is construed as changing the wavelength of incoming absorbed light to emitted light of longer wavelengths.

It is an eighth objective of the invention to provide 400-500 nm, 600-800 nm or both frequency ranges partial or complete wavelength up-conversion of semiconductor quantum dot chip radiation, the chip having emission at 300-500 nm range emission range. The wavelength up-conversion is realized by using either organic, inorganic or combination of both types of materials.

It is a ninth objective of the invention to provide the wavelength up-conversion using nano-sized particle material for the up-conversion.

It is a tenth objective of the invention to provide the wavelength up-conversion using molecular like material for the up-conversion.

It is an eleventh objective of the invention to provide the wavelength up-conversion using a polymeric material wherein the up-conversion material is covalently bonded to the polymer matrix providing the wavelength up-conversion.

It is a twelfth objective of the invention to present a quantum dot based lighting fixture where the spectral band 500-600 nm is suppressed. In this suppressed band there is hardly any or no emission at all, or in any case less emission than in either of the adjacent bands 400-500 nm, 600-700 nm. The suppression can be achieved in accordance with the invention by not having any or only a small amount of primary emission in the band 400-500 nm, and by making sure that any up-conversion causes a wavelength shift that shifts the wavelength beyond 600 nm. It is generally known that green plants cannot utilize green light (500-600 nm) radiation as well as the radiation in the adjacent bands, as this radiation merely reflects from the plant rather than is being absorbed for photosynthetic conversion.

It is a thirteenth objective of the invention to present a quantum dot based lighting fixture that maximizes anabolic growth of plants by providing desired far-red light, whereas it minimizes green light which from the perspective of plant cultivation is radiation that wastes energy. This objective is realized in one aspect of the invention by a blue quantum dot light emitter with a wavelength up-conversion device which up-converts part of the emitted blue light (300-500) nm into a broad red spectrum component (600-800 nm) which has a far-red component, but omits and/or minimizes the green component (500-600 nm).

The present invention provides a quantum dot and a related light fixture suitable for greenhouse cultivation. According to the invention, the quantum dot has a specific emission frequency pattern, viz. it has at least two spectral characteristics; one emission peak with a full width at half maximum of at least 50 nm or more and having a peak wavelength in the range of 600 to 700 nm, and a second spectral characteristics having a peak wavelength below 500 nm range. The emission peaks of the quantum dots match well with a plant photosynthesis response spectrum and is therefore particularly suitable for high efficiency artificial lighting.

Some or all of the aforementioned advantages of the invention are accrued with a quantum dot size distribution that optimises the emission spectrum for the said photomorphogenetic variable affected, which can be any of the following biological parameters: weight, leaf number, root mass, stem height, chemical composition (such as vitamin, mineral, and/or nutrient content and/or concentration) the plant has at different time points or at harvesting maturity.

A lighting device for plant cultivation is in accordance with the invention and characterised in that said lighting device comprises a plurality of quantum dots of different size.

A lighting method for plant cultivation is in accordance with the invention and characterised in that light is produced by a plurality of quantum dots of different size and said light illuminates at least one plant.

A greenhouse and/or growth chamber light device is in accordance with the invention and characterised in that said light device comprises at least one quantum dot.

A horticultural lighting fixture in accordance with the invention comprises at least one quantum dot having
a) first spectral characteristics including a peak in the wavelength range from 600 to 700 nm and arranged to exhibit a full width at half maximum of at least 50 nm or more;
b) second spectral characteristics with a maximum of 50 nm full width at half maximum and arranged to exhibit a peak wavelength in the range from 440 to 500 nm, and optionally
c) all or part of the emission at a frequency of 600-800 nm is generated using a whole or partial wavelength up-conversion of the quantum dot chip radiation power and/or by another electrically powered quantum dot.

A horticultural lighting fixture in accordance with the invention comprises at least one quantum dot having
a) first spectral characteristics including a peak in the wavelength range from 600 to 700 nm and arranged to exhibit a full width at half maximum of at least 50 nm or more;
b) second spectral characteristics with a maximum of 50 nm full width at half maximum and arranged to exhibit a peak wavelength in the range from 440 to 500 nm, and
c) at least a part or the whole of the emission at wavelengths of 500-600 nm is arranged to be minimized and/or omitted and/or to be reduced below the intensity in 400-500 nm band and below the intensity in 600-700 nm band.

Use of the lighting device or fixture of any of the five preceding paragraphs is in accordance with the invention in providing light for at least one plant with the said at least one plant in ambient light or in a dark cavity with said lighting device or fixture as the sole source of light. Similarly a method for enhancing plant growth of the five preceding paragraphs is in accordance with the invention wherein at least one lighting device or fixture emits light to at least one plant with the said at least one plant in ambient light or in a dark cavity with said lighting device or fixture as the sole source of light.

A light emitting component of a horticultural light is in accordance with the invention and comprises;
a light emitting quantum dot semiconductor chip; and
a light wavelength up-conversion quantum dot which is deposited in direct proximity of the quantum dot chip;
said component being capable of emitting two characteristic light emission peaks, and at least a part or the whole of the emission at wavelengths of 500-600 nm is arranged to be minimized and/or omitted and/or to be reduced below the intensity in 400-500 nm band and below the intensity in 600-700 nm band.

Use of the light emitting component of the preceding paragraph, is in accordance with the invention, in providing light for at least one plant with the said at least one plant in ambient light or in a dark cavity with said lighting device or fixture as the sole source of light. Similarly a method for enhancing plant growth, is in accordance with the invention, wherein at least one light emitting component of the preceding paragraph emits light to at least one plant with the said at least one plant in ambient light or in a dark cavity with said lighting device or fixture as the sole source of light.

A horticultural lighting fixture in a dark or shaded cavity is in accordance with the invention and comprises at least one LED having
a) first spectral characteristics including a peak in the wavelength range from 600 to 700 nm and arranged to exhibit a full width at half maximum of at least 50 nm or more;
b) second spectral characteristics with a maximum of 50 nm full width at half maximum and arranged to exhibit a peak wavelength in the range from 440 to 500 nm, and
c) all or part of the emission at a frequency of 600-800 nm is generated using a whole or partial wavelength up-conversion of the LED chip radiation power.

A horticultural lighting fixture in a dark or shaded cavity is in accordance with the invention and comprises at least one LED having
a) first spectral characteristics including a peak in the wavelength range from 600 to 700 nm and arranged to exhibit a full width at half maximum of at least 50 nm or more;
b) second spectral characteristics with a maximum of 50 nm full width at half maximum and arranged to exhibit a peak wavelength in the range from 440 to 500 nm, and
c) at least a part or the whole of the emission at wavelengths of 500-600 nm is arranged to be minimized and/or omitted and/or to be reduced below the intensity in 400-500 nm band and below the intensity in 600-700 nm band.

The quantum dot and/or LED based implementations of the invention allow very fine spectral tuning of the emission spectrum, and therefore very good energy efficiency and improved photomorphogenetic control in plant cultivation relying on artificial light. This advantage is even more pronounced when using quantum dots only, as the spectral tuning provided by them is superior to conventional LEDs. Furthermore, the quality of the harvests is considerably improved with the light devices of the invention and this brings a multitude of advantages related to cultivation in dark growth chambers or chambers with very limited ambient light: Firstly plants may be grown closer to the site of consumption, e.g. in residential basements in big cities, thereby eliminating transportation costs. Secondly, plants may be grown in geographies where agriculture is not traditionally possible, e.g. hot desert conditions in the summer.

Thirdly, as the quality of the plants is improved also the consistency between individual plants is improved which makes harvesting easier. This is because there are less rejected individuals and machine vision based harvesting equipment can recognize the plants better when they have a consistent quality, size and colour. Fourthly, the properties of the plants may be varied in a controlled fashion because nearly all growth parameters are under control, which is especially advantageous when cultivating flowers and ornamental plants. Fifthly, a constant photon dose everyday for the plants assists in the administration of nutrients, as the nutrient dose can be maintained the same year round. Sixthly, in very hot and sunny geographies plants may be grown in dark opaque growth chambers that reflect sunlight. The energy spent in the artificial illumination of the invention is considerably less than what would have been expended in air conditioning or cooling the plant under sunlight.

It should be noted that a dark cavity is construed as a light constrained space that has zero or low levels of sunlight and/or ambient light without the artificial light source of the invention emitting photons, but the said cavity can be of any size, microscopically small, a flower pot size, a 10 m² residential/business basement, a shipping cargo container, the size or a football field, e.g. basement of a football stadium, and/or a skyscraper with 20 floors where enough vegetables are grown for an entire city at one or more floors.

In addition and with reference to the aforementioned advantage accruing embodiments, the best mode of the invention is considered to be a lighting device with binary alloy quantum dots made by colloidal methods to produce a size distribution of quantum dots that produces an emission spectrum otherwise similar to photosynthetically active radiation (PAR) spectrum except that the emission spectrum omits or provides a very low intensity in the green yellow (500-600) nm and comprises a high intensity spectral feature in the far red 700-800 nm band.

BRIEF DESCRIPTION OF THE DRAWINGS

In the following the invention will be described in greater detail with reference to exemplary embodiments in accordance with the accompanying drawings, in which.

Some of the embodiments are described in the dependent claims.

DETAILED DESCRIPTION OF EMBODIMENTS

Figure 1A:
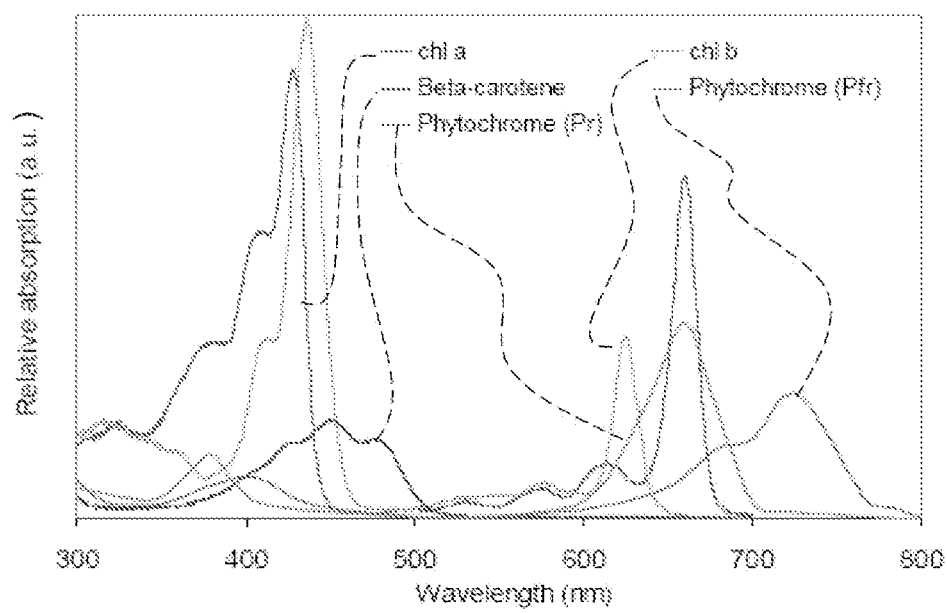
FIG. 1A shows relative absorption spectra of the most common photosynthetic and photomorphogenetic photoreceptors in green plants.
Figure 1B:
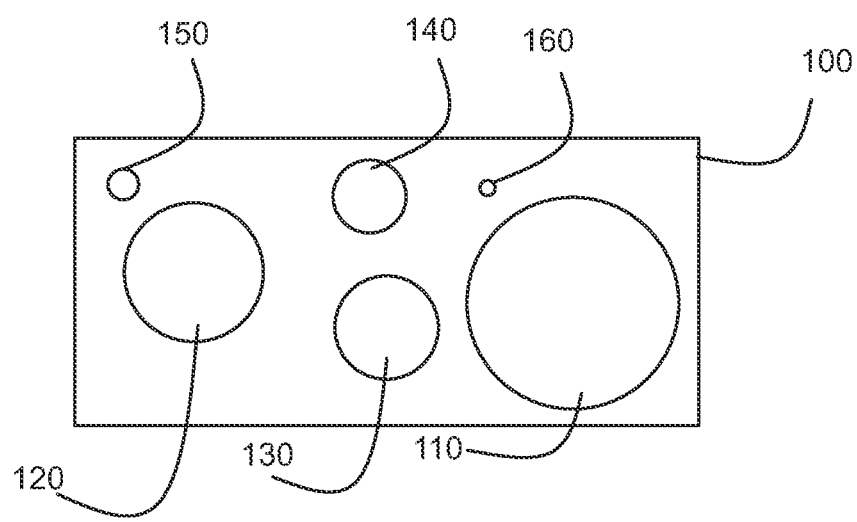
FIG. 1B demonstrates an embodiment of the inventive lighting device 10 as a block diagram.

FIG. 1B shows a lighting device 100 comprising a plurality of quantum dots 110, 120, 130, 140, 150 and 160 of different sizes. The size distribution of quantum dots comprises quantum dots of different sizes within the range of 2 nm-200 nm, i.e. quantum dot 110 typically having a diameter of 200 nm and quantum dot 160 having a diameter of approximately 2 nm.

Electric power and electrodes (not shown) is used to produce an electric field to excite an electron in a quantum dot in the usual way. As the electron relaxes to a lower energy state, it emits a photon with a wavelength dictated by the energy difference between the excited and the relaxed state. These emitted photons produce the emission spectrum of the lighting device 100.

In some embodiments the quantum dots 150, 160 are arranged to transmit UV/blue light in the 250-400 nm range, the quantum dots 140 and 130 are arranged to transmit green and/or yellow light 400-600 nm, and quantum dot 120 is arranged to transmit red light 600-700 nm, and the quantum dot 110 is arranged to transmit far red light in the band of 700-800 nm.

The relative emission intensity and number of quantum dots 110, 120, 130, 140, 150 and 160 of certain size is varied to produce an aggregate emission spectrum similar and/or identical to photosynthetically active radiation (PAR) spectrum in some embodiments. More preferably the said emission spectrum resembling PAR spectrum omits or provides a very low intensity in the green yellow (500-600) nm and comprises a high intensity spectral feature in the far red 700-800 nm band in accordance with the invention.

All or some of the quantum dots 110, 120, 130, 140, 150 and 160 are typically manufactured from any of the following alloys: cadmium selenide, cadmium sulphide, indium arsenide, indium phosphide and/or cadmium selenide sulphide in some embodiments.

It should be noted that in more elaborate embodiments the size of at least one said quantum dot 110, 120, 130, 140, 150 and/or 160 is chosen so that the said quantum dot produces photon emission in a band in the photon spectrum with a certain photomorphogenetic effect in plants. The said photomorphogenetic variable effected could be any of the following biological parameters: weight, leaf number, root mass, stem height, chemical composition (such as vitamin, mineral, and/or nutrient content and/or concentration) the plant has at different time points or at harvesting maturity in some embodiments of the invention.

In some embodiments at least one said quantum dot 110, 120, 130, 140, 150 and/or 160 is produced by colloidal synthesis. In colloidal synthesis colloidal semiconductor nanocrystals are synthesized from precursor compounds dissolved in solutions, much like traditional chemical processes. Typically the synthesis of colloidal quantum dots is based on a three-component system composed of: precursors, organic surfactants, and solvents. The reaction medium is heated to a sufficiently high temperature, and the precursors chemically transform into monomers. Once the monomers reach a high enough supersaturation level, the nanocrystal growth starts with a nucleation process. The temperature during the growth process is one of the critical factors in determining optimal conditions for the nanocrystal growth in some embodiments. The temperature is typically high enough to allow for rearrangement and annealing of atoms during the synthesis process while being low enough to promote crystal growth. Another critical factor that is controlled during nanocrystal growth is the monomer concentration in some embodiments.

The growth process of nanocrystals can occur in two different regimes, usually described as "focusing" and "defocusing". At high monomer concentrations, the critical size (the size where nanocrystals neither grow nor shrink) is relatively small, resulting in growth of nearly all particles. In this regime, smaller particles grow faster than large ones, since larger crystals need more atoms to grow than small crystals, and this results in "focusing" of the size distribution to yield nearly monodisperse particles. The size focusing is typically optimal when the monomer concentration is kept such that the average nanocrystal size present is always slightly larger than the critical size. When the monomer concentration is depleted during growth, the critical size becomes larger than the average size present, and the distribution "defocuses" as a result of Ostwald ripening.

There are colloidal methods to produce many different semiconductors. Typical dots of the invention are made of binary alloys such as cadmium selenide, cadmium sulfide, indium arsenide, and indium phosphide. Although, dots may also be made from ternary alloys such as cadmium selenide sulfide in some embodiments. These quantum dots can contain as few as 100 to 100,000 atoms within the quantum dot volume, with a diameter of 10 to 50 atoms. This corresponds to about 2 to 10 nanometers.

It is in accordance with the invention to produce different populations of quantum dots by different methods of colloidal synthesis, or other methods, and then combine the said populations to yield a size distribution that provides the desired emission spectrum for plant cultivation.

It should be noted that the embodiment 10 can be used together with conventional LEDs in accordance with the invention. The embodiment 10 is also suited to be used as illumination source for at least one plant in a dark growth cavity and/or chamber, or a cavity with low levels of ambient light.

It should also further be noted that the embodiment 10 can be readily permuted and/or combined with any of the embodiments 20, 30, 31, 40, 50, 60, 70 and/or 80.

Figure 2:
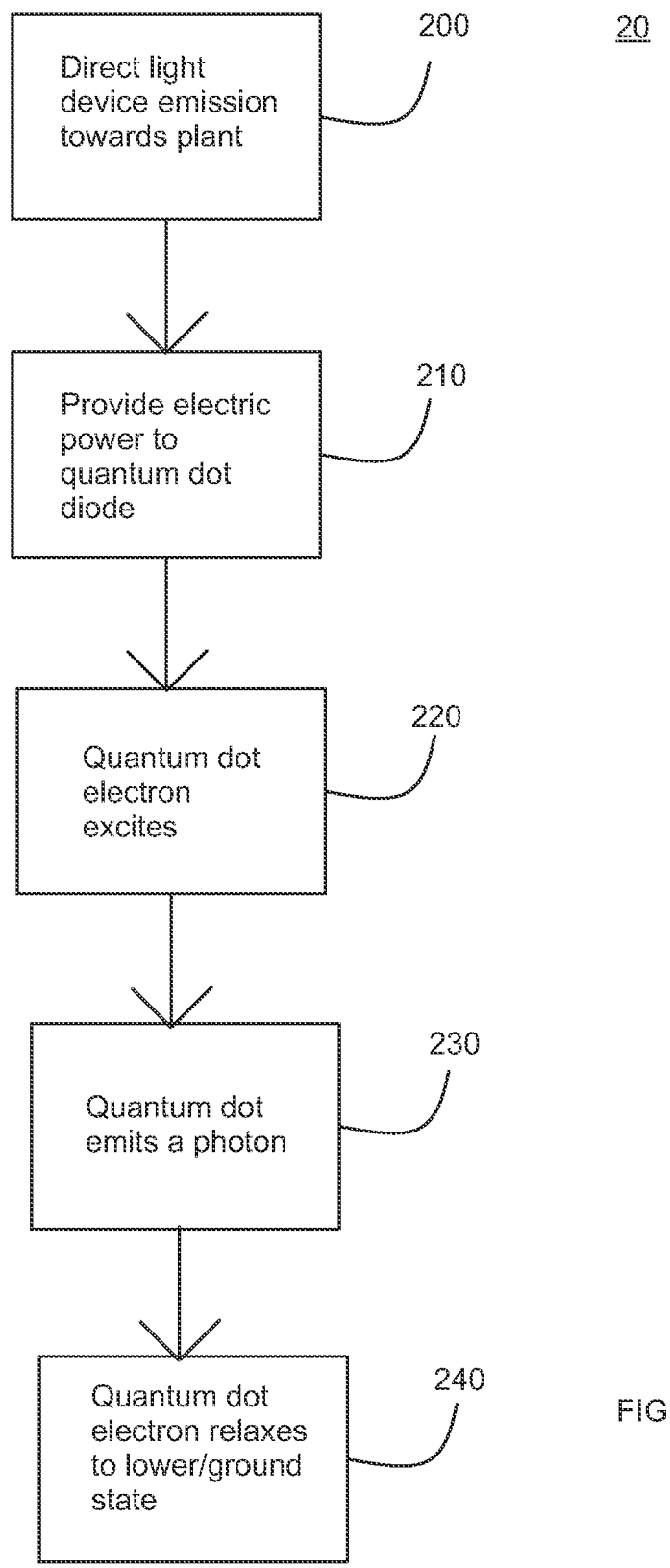
FIG. 2 demonstrates an embodiment 20 of the lighting method in accordance with the invention as a flow diagram.

FIG. 2 shows the operation of the lighting device of the invention, for example in a greenhouse environment. In phase 200 light emission is directed from the lighting device towards at least one plant.

In phase 210 electric power is provided to the lighting device and at least one quantum dot in said lighting device, which produces an electric field. The electric field excites an electron in a quantum dot to a higher energy state in phase 220.

As the electron relaxes to a lower energy state, it emits a photon with a wavelength dictated by the energy difference between the excited and the relaxed state in phases 230 and 240. These emitted photons produce the emission spectrum that is transmitted from the lighting device.

In some embodiments UV/blue light in the 250-400 nm range, green and/or yellow light in the 400-600 nm range, red light 600-700 nm, and/or far red light in the band of 700-800 nm are emitted by quantum dots of different sizes in the method of the invention. Typically larger quantum dots emit red light of longer wavelength and smaller quantum dots blue light of shorter wavelengths in some embodiments of the invention.

It should be noted that the embodiment 20 can be used together with conventional LEDs in accordance with the invention. The embodiment 20 is also suited to be used as illumination method for at least one plant in a dark growth cavity, or a cavity with low levels of ambient light.

It should also further be noted that the embodiment 20 can be readily permuted and/or combined with any of the embodiments 10, 30, 31, 40, 50, 60, 70 and/or 80.

Figure 3:
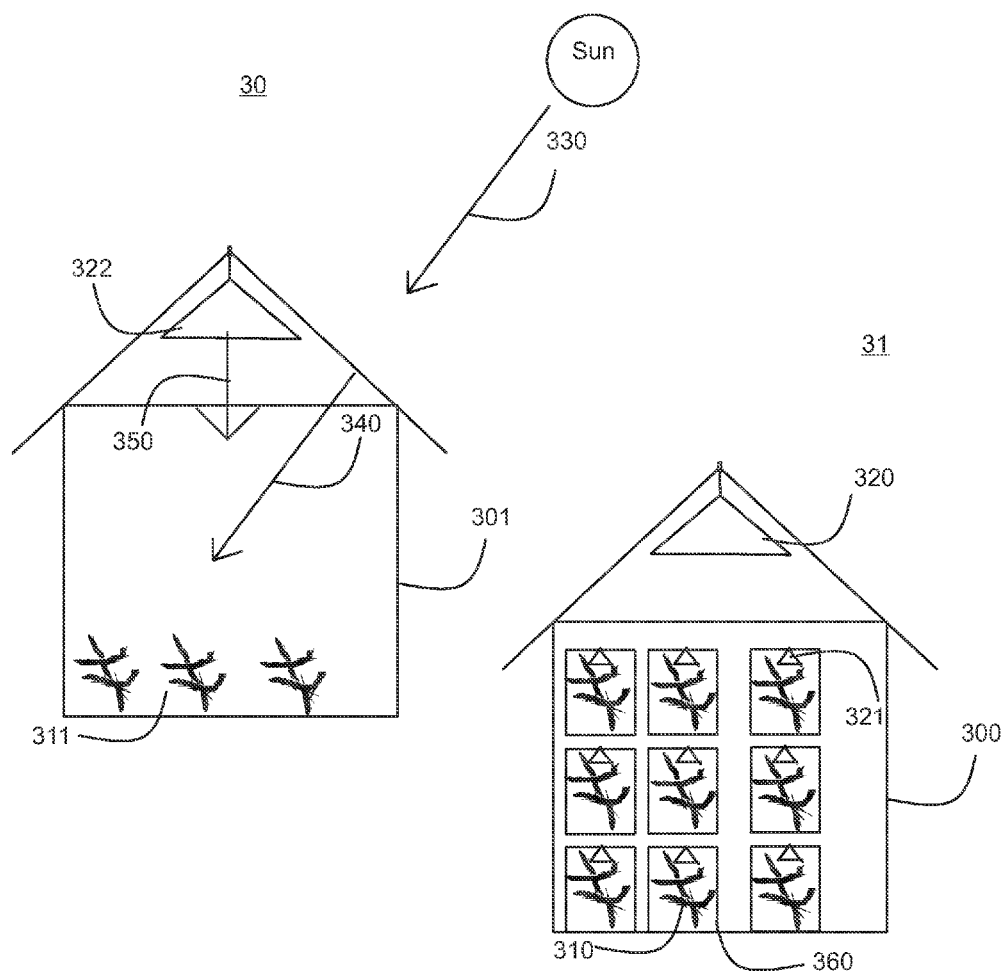
FIG. 3 demonstrates an embodiment 30 of the use of the inventive lighting device as a block diagram.

FIG. 3 shows different use configuration embodiments 30, 31 of the inventive artificial greenhouse illumination device and method. In one embodiment 30 the plants 311 are cultivated on the floor of a greenhouse with transparent walls 301. A lighting device 322 with a plurality of quantum dots is located in a position from where photons emitted by it can reach as many plants 311 as possible with maximum emission flux. In some embodiments the emission spectrum 350 of the lighting device is adjusted to complement the natural light spectrum that is the sunlight that is transmitted through the wall 301. In some embodiments the lighting device 322 may comprise quantum dots arranged to transmit those wavelengths that are filtered and/or attenuated by the greenhouse walls in accordance with the invention.

In embodiment 31 the plants to be cultivated are stacked in growth chambers 360 in the greenhouse 300. In some embodiments each growth chamber has a lighting device 321. Even if the plants are stacked in transparent growth chambers, there is a greater reduction and/or attenuation of sunlight than in embodiment 30 as some of the photons need to transmit through more than one transparent wall. Therefore, the lighting device 321 with quantum dots typically complements the natural light spectrum of multiple transmissions as above, or in the case of an opaque chamber provides all light radiation to plants 310. In some embodiments there are both dedicated lighting devices for growth chambers and at least one lighting device 320 shared by more than one plant 310 in one or more growth chambers 360.

In some embodiments the quantum dots are arranged to produce an emission spectrum that when combined with transmitted spectrum 340 is similar to photosynthetically active radiation (PAR) spectrum. Preferably the said produced emission spectrum omits or provides a very low intensity in the green yellow (500-600) nm and comprises a high intensity spectral feature in the far red 700-800 nm band in some embodiments. This is especially preferred when the light device is used in dark growth chambers.

In some embodiments at least one quantum dot in the lighting device is chosen to emit in a band in the photon spectrum which band has a certain photomorphogenetic effect in plants. The said photomorphogenetic variable effected could be any of the following biological parameters: weight, leaf number, root mass, stem height, chemical composition (such as vitamin, mineral, and/or nutrient content and/or concentration) of the plant 310, 311 at different time points or at harvesting maturity.

It should be noted that the embodiment 30 can be used together with conventional LEDs in accordance with the invention. The embodiments 30, 31 are also suited to be implemented with growth chambers 360 of any level of opaqueness or transparency.

It should also further be noted that the embodiments 30 and 31 can be readily permuted and/or combined with each other and/or with any of the embodiments 10, 20, 40, 50, 60, 70 and/or 80.

Figure 4:
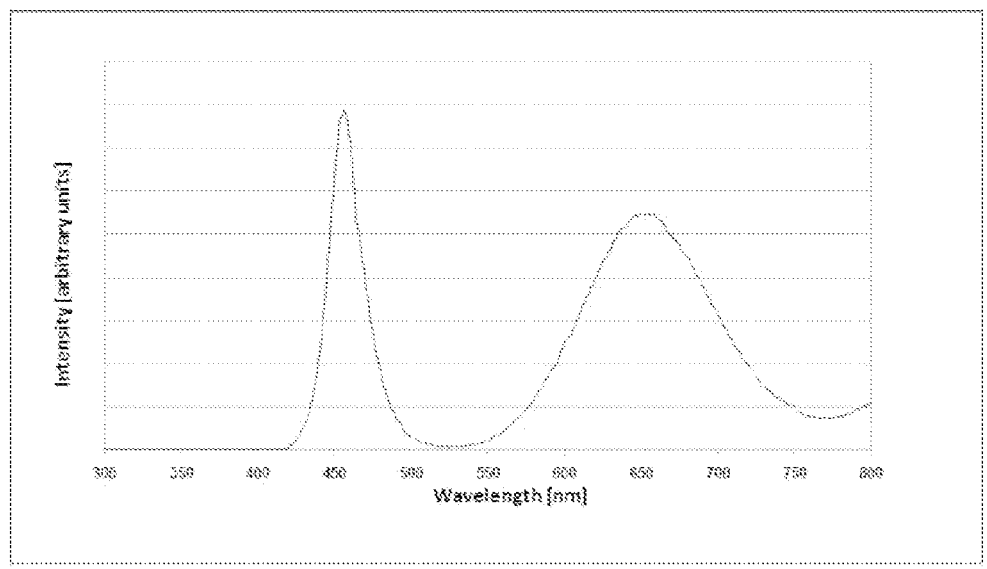
FIG. 4 shows the embodiment 40 with emission peaks of a first single light emission source quantum dot device according to the invention.

In FIG. 4, the semiconductor quantum dot chip emission frequency peaks at a wavelength of 457 nm with emission peak Full width at half maximum (FWHM) of 25 nm. In this case the wavelength up-conversion is done by using two up-conversion materials. These two wavelength up-conversion materials have individual emission peaks at 660 nm and 604 nm. These materials can be quantum dots in some embodiments. FIG. 4 shows the combined emission peak from these two wavelength up-conversion materials peaking at 651 nm wavelength with emission peak FWHM of 101 nm. In this case about 40% (calculated from the peak intensities) of the semiconductor quantum dot chip emission, is up-converted to 651 nm emission by two individual up-conversion materials.

In some embodiments up-conversion is not used, and the longer wavelength spectral feature is emitted by at least one quantum dot that is driven by electric power.

It should be noted that the spectrum 40 can be used and implemented together with conventional LEDs. Spectrum 40 can be implemented by at least one quantum dot and at least one LED in combination in accordance with the invention. The spectrum 40 is especially suited to be used for illuminating at least one plant in a dark growth cavity, or a cavity with low levels of ambient light.

It should also further be noted that the embodiment 40 can be readily permuted and/or combined with any of the embodiments 10, 20, 30, 31, 50, 60, 70 and/or 80.

Figure 5:
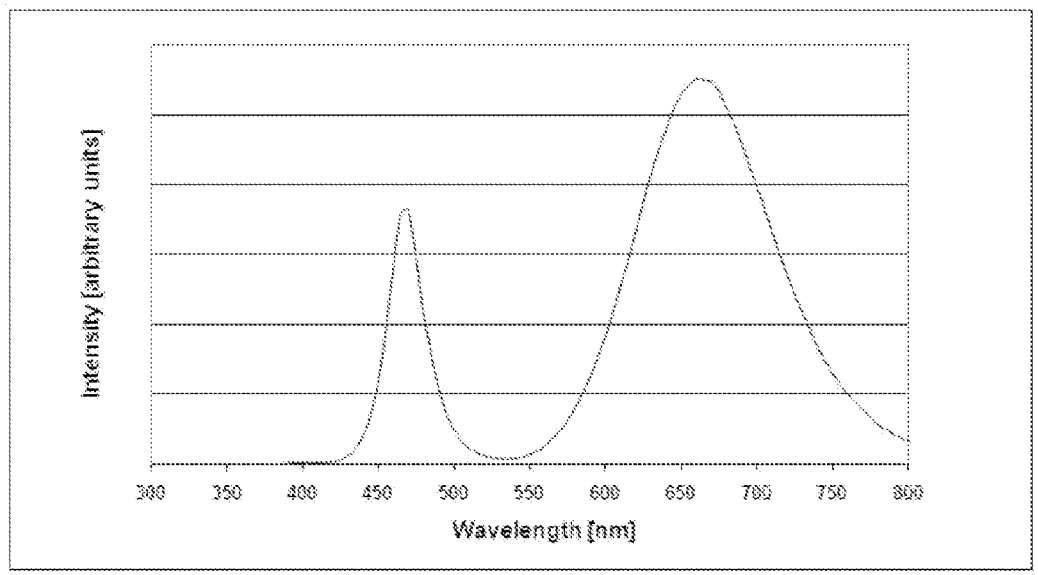
FIG. 5 shows the embodiment 50 with the emission peaks of a second single light emission source quantum dot device according to the invention.

In FIG. 5, the semiconductor quantum dot chip emission frequency peaks at a wavelength of 470 nm with emission peak Full width at half maximum (FWHM) of 30 nm. In this case the wavelength up-conversion is done by using two up-conversion materials. These two wavelength up-conversion materials have individual emission peaks at 660 nm and 604 nm. These materials can be quantum dots in some embodiments. FIG. 5 shows the combined emission peak from these two wavelength up-conversion materials peaking at 660 nm wavelength with emission peaks FWHM of 105 nm. In this case about 60% (calculated from the peak intensities) of the semiconductor LED chip emission, is up-converted to 660 nm emission by two individual "up-conversion" materials.

In some embodiments up-conversion is not used, and the longer wavelength spectral feature is emitted by at least one quantum dot that is driven by electric power.

It should be noted that the spectrum 50 can be used and implemented together with conventional LEDs. Spectrum 50 can also be implemented by at least one quantum dot and at least one LED in combination in accordance with the invention. The spectrum 50 is especially suited to be used for illuminating at least one plant in a dark growth cavity, or a cavity with low levels of ambient light.

It should also further be noted that the embodiment 50 can be readily permuted and/or combined with any of the embodiments 10, 20, 30, 31, 40, 50, 60, 70 and/or 80.

Figure 6:
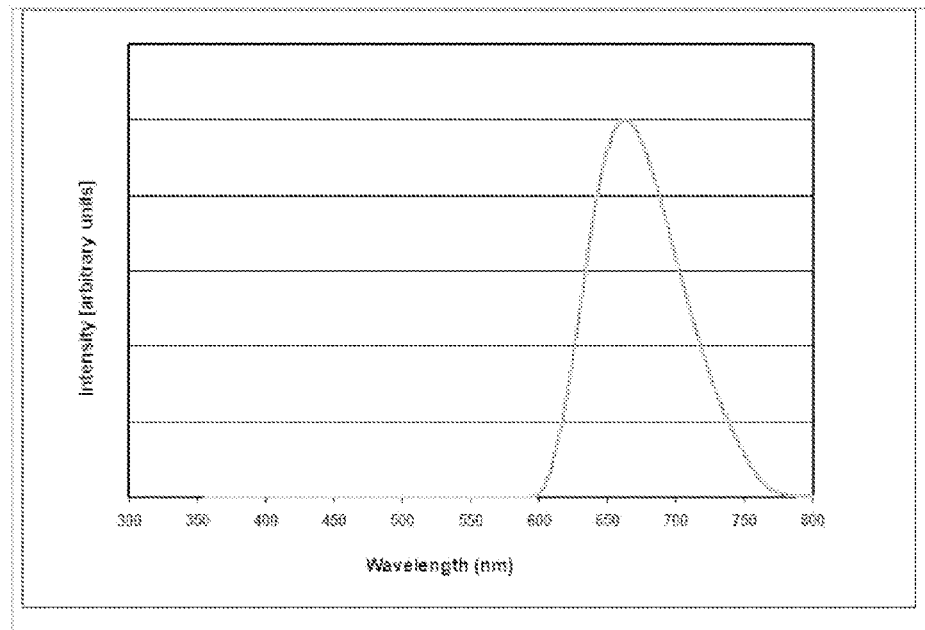
FIG. 6 shows the embodiment 60 with the emission peaks of a third single light emission source quantum dot device according to the invention.

In FIG. 6, the semiconductor LED chip emission frequency peaks at a wavelength of 452 nm with emission peak Full width at half maximum (FWHM) of 25 nm (not shown in the FIG. 6). In this case the wavelength up-conversion is done by using one up-conversion material. This material can be a quantum dot in some embodiments. FIG. 6 shows the emission peak from this up-conversion material peaking at 658 nm wavelength with emission peak FWHM of 80 nm. In this case about 100% (calculated from the peak intensities) of the semiconductor quantum dot chip emission, is up-converted to 658 nm emission by the up-conversion material. This can be noticed from the FIG. 6, as there is no 452 nm emission exiting the quantum dot device.

In some embodiments up-conversion is not used, and the longer wavelength spectral feature is emitted by at least one quantum dot that is driven by electric power.

It should be noted that the spectrum 60 can be used and implemented together with conventional LEDs. Spectrum 60 can be implemented also by at least one quantum dot and at least one LED in combination in accordance with the invention. The spectrum 60 is especially suited to be used for illuminating at least one plant in a dark growth cavity, or a cavity with low levels of ambient light.

It should also further be noted that the embodiment 60 can be readily permuted and/or combined with any of the embodiments 10, 20, 30, 31, 40, 50, 70 and/or 80.

Figure 7:
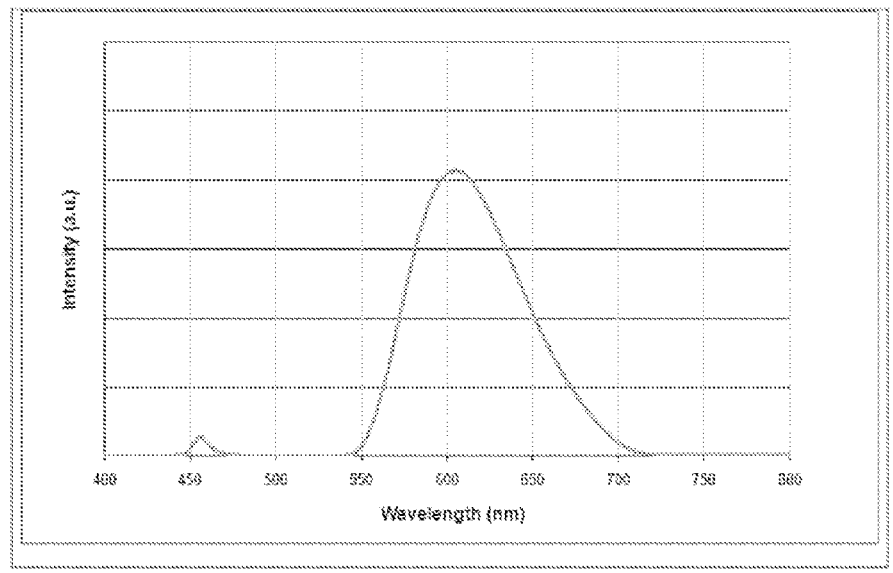
FIG. 7 shows the embodiment 70 with the emission peaks of a fourth single light emission source quantum dot device according to the invention.

In FIG. 7, the semiconductor quantum dot chip emission frequency peaks at a wavelength of 452 nm wavelength with emission peak Full width at half maximum (FWHM) of 25 nm. In this case the wavelength up-conversion is done by using one up-conversion material. This material can be a quantum dot in some embodiments.

FIG. 7 shows the emission peak from this up-conversion material peaking at 602 nm wavelength with emission peak FWHM of 78 nm. In this case about 95% (calculated from the peak intensities) of the semiconductor quantum dot chip emission, is up-converted to 602 nm emission by the wavelength up-conversion material.

In some embodiments up-conversion is not used, and the longer wavelength spectral feature is emitted by at least one quantum dot that is driven by electric power.

It should be noted that the spectrum 70 can be used and implemented together with conventional LEDs. Spectrum 70 can be implemented also by at least one quantum dot and at least one LED in combination in accordance with the invention. The spectrum 70 is especially suited to be used for illuminating at least one plant in a dark growth cavity, or a cavity with low levels of ambient light.

It should also further be noted that the embodiment 70 can be readily permuted and/or combined with any of the embodiments 10, 20, 30, 31, 40, 50, 60 and/or 80.

Figure 8:
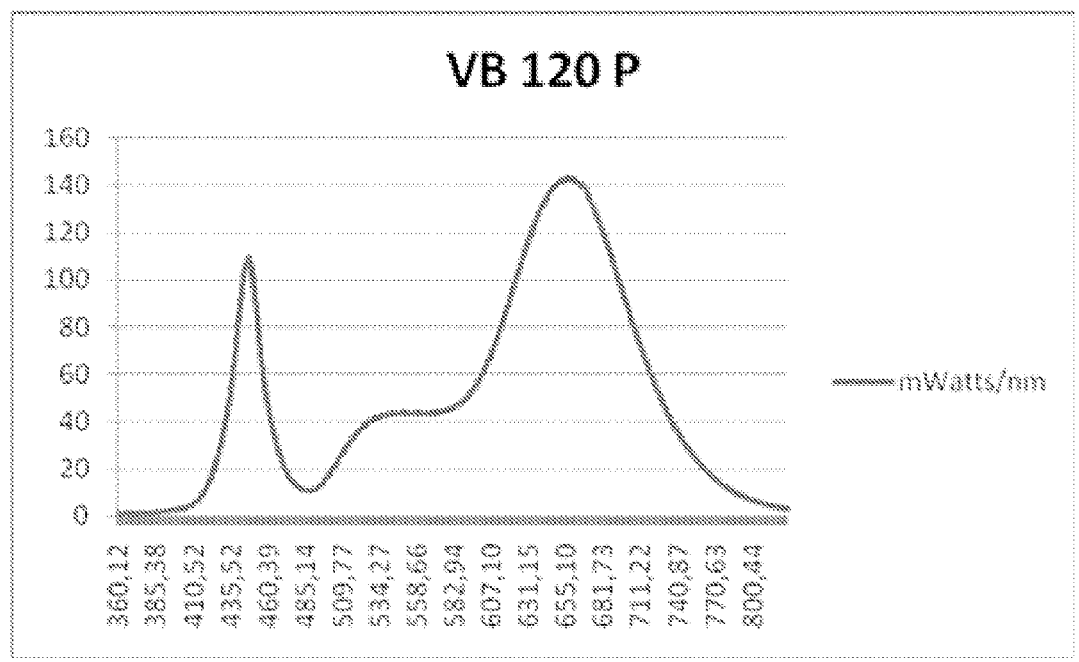
FIG. 8 shows the embodiment 80 with the spectrum that has been discovered to maximize the biomass of plants according to the invention.

FIG. 8 shows an optimised spectrum 80 that maximises biomass production in plants. The optimised spectrum is preferably produced with the lighting devices of the invention described in this application. Spectrum 80 has special advantages in growth chamber cultivation, where the growth chamber is a dark chamber, i.e. has zero or low levels of sunlight and/or ambient light. The light device of the invention producing spectrum 80 can be placed into said chamber and maximise biomass production in accordance with the invention. The inventor has experimentally discovered the biomass maximising feature of spectrum 80.

It should also further be noted that the embodiment 80 can be readily permuted and/or combined with any of the embodiments 10, 20, 30, 31, 40, 50, 60 and/or 70.

The used quantum dot materials and sizes should be selected in the way that a desired emission spectra from the quantum dot device is achieved.

To summarize, by tuning the quantum dot species and size distribution it is possible to tune the desired emission spectra from the quantum dot device device and by tuning the quantum dot number it is possible to tune the desired quantum dot chip emission quantity/amount for the quantum dot device.

The present invention also concerns a lighting fixture for facilitating plant growth comprising at least one quantum dot having spectral characteristics including a peak in the wavelength range from 600 to 700 nm.

By using this approach, the light sources can be designed to reach superior PPF and PPF per watt efficiency and performance and very low power consumption and very long operation lifetime when compared to the existing technologies.

In some embodiments the emission at a frequency of 300-500 nm is generated by the semiconductor quantum dot chip and the emission at frequency of 400-800 nm is generated using a complete or partial wavelength up-conversion of the quantum dot chip radiation power. The partial wavelength up-conversion can be selected to be in range of 5-95%, preferably 35-65%, of the semiconductor quantum dot chip radiation. The wavelength up-conversion to produce the 400-800 nm radiation is achieved by using one or more up-conversion materials in proximity with the quantum dot emission source in some embodiments.

In this application "adjustable" peak wavelength as in the above is construed as a peak wavelength that can be adjusted during assembly of the lighting fixture at the factory, and/or also "adjustable" as in an adjustable dial in the lighting fixture for on site peak wavelength adjustment. In addition adjusting the peak wavelengths of the quantum dots during manufacturing process of the device is also in accordance with the invention, and "adjustable" should be construed to also include adjustments made during the manufacturing process of the quantum dot. All aforementioned embodiments of an adjustable peak wavelength, or any other adjustable light source or quantum dot variable are within the scope of this patent application.

In one special exemplary embodiment of the invention CdSe—ZnS (core-shell) quantum dot nano particles with average particle size of 6.6 nm with approximately +/−0.5 nm particle size distribution were mixed with a two component silicone encapsulant resin. The mixing ratio was 0.2 w-% of nano particles in the silicone resin. The resin containing nano particles were dispensed as encapsulant into a plastic leaded chip carrier (PLCC) consisting a InGaN light emitting diode in the PLCC cavity. The light emitting diodes was determined to have electroluminescent emission at 450 nm wavelength range.

The InGaN containing PLCC package with nano particles containing encapsulant material was connect to a DC voltage power source with forward voltage of 3.2V and current of 350 mA. The device optical emission spectrum was characterized to result in two emission peaks one at 450 nm wavelength range and the second at the 660 nm wavelength range. The 660 nm wavelength range emission peak's full width at half maximum was observed to be over approximately 60 nm. The intensity ratios of the 450 nm and 660 nm peaks were 0.5:1. The aforementioned experiment has been conducted by the applicant. It is in accordance with the invention to produce several quantum dots as described above, some of different sizes. These quantum dots, one or many quantum dots may be driven with electric current/voltage from a power source or the said one or many quantum dots may be driven by optical excitation or both optical excitation and electric current/voltage from a power source in accordance with the invention.

It is in accordance with the invention to include quantum dots with different peak emissions in one luminaire and to control these in order to provide a desirable spectral emission to achieve a determined growth result or physiological response. In this way, the lighting system would allow a versatile control of lighting intensity and spectrum. Ultimately, the control of other abiotic parameters such as $CO_2$ concentration, temperature, daylight availability and humidity could be integrated within the same control system together with lighting, optimizing the crop productivity and the overall management of the greenhouse.

The invention has been explained above with reference to the aforementioned embodiments and several commercial and industrial advantages have been demonstrated. The methods and arrangements of the invention allow more precise spectral tuning of the emission spectrum for lights used in plant cultivation. The invention therefore realises unexpected improvements in the photomorphogenetic control of plant growth, and further improvements in plant production. The invention also considerably improves the energy efficiency of plant cultivation relying on artificial light. Furthermore, the quality of the harvests is considerably improved with the light devices of the invention and this brings a multitude of advantages related to cultivation in dark growth chambers or chambers with very limited ambient light: Firstly plants may be grown closer to the site of consumption, e.g. in residential basements in big cities, thereby eliminating transportation costs. Secondly, plants may be grown in geographies where agriculture is not traditionally possible, e.g. hot desert conditions in the summer. Thirdly, as the quality of the plants is improved also the consistency between individual plants is improved which makes harvesting easier. This is because there are less rejected individuals and machine vision based harvesting equipment can recognize the plants better when they have a consistent quality, size and colour. Fourthly, the properties of the plants may be varied in a controlled fashion because nearly all growth parameters are under control, which is especially advantageous when cultivating flowers and ornamental plants. Fifthly, a constant photon dose everyday for the plants assists in the administration of nutrients, the nutrient dose can be maintained the same year round. Sixthly, in very hot and sunny geographies plants may be grown in dark opaque growth chambers that reflect sunlight, and are closed with lids. The energy spent in the artificial illumination of the invention is considerably less than what would have been expended in air conditioning or cooling the plant under sunlight.

The invention has been explained above with reference to the aforementioned embodiments. However, it is clear that the invention is not only restricted to these embodiments, but comprises all possible embodiments within the spirit and scope of the inventive thought and the following patent claims.

REFERENCE

WO 2010/053341 A1, "Phosphor conversion light-emitting diode for meeting photomorphogenetic needs of plants", Zukauskas et al. 2010.

WO 2009/048425 A1, "Fabrication of Phosphor free red and white nitride-based LEDs", Soh et al. 2009.

The invention claimed is:

1. A plant cultivation lighting device, comprising:
    a lighting system including a plurality of quantum dots of different sizes, each of the quantum dots being configured to produce light of a specific wavelength based on the size of the respective quantum dot,
    wherein the light produced by the quantum dots is absorbable by photomorphogenetic receptors of plants and thereby results in the lighting device producing an aggregate emission spectrum that causes a photomorphogenetic effect in the plants, and
    wherein the size distribution of said plurality of quantum dots produces the aggregate emission spectrum that is the same as the photosynthetically active radiation (PAR) spectrum, except that the emission spectrum omits or provides a very low intensity in the green yellow (500-600) nm band and comprises a high intensity spectral feature in the far red 700-800 nm band.

2. The lighting device as claimed in claim 1, further comprising a plurality of multiple quantum well structures for at least one light emitting diode, and at least one quantum well structure comprising quantum dot structures on a barrier layer.

3. The lighting device as claimed in claim 1, wherein the quantum dots emit photons to the plants in a band or in various bands with preset relative intensities in the photon spectrum that cause the photomorphogenetic effect in the plants.

4. The lighting device as claimed in claim 3, wherein the photomorphogenetic effect is one or more of the following biological parameters: weight, leaf number, root mass, stem height, and chemical composition including one or more of vitamin, mineral, nutrient content, and nutrient concentration of the plant at different time points or at harvesting maturity.

5. The lighting device as claimed in claim 1, wherein at least one of said quantum dots is made of any of the following alloys: GaN, InGaN, AlGaN, GaAs, cadmium selenide, cadmium sulphide, indium arsenide, indium phosphide and/or cadmium selenide sulphide or any combination thereof.

6. The lighting device as claimed in claim 1, wherein the size distribution of the quantum dots comprises quantum dots of different sizes within the range of 1 nm-20 nm.

7. The lighting device as claimed in claim 1, wherein at least one of said quantum dots is produced by a metal organic chemical vapor deposition (MOCVD) process.

8. The lighting device as claimed in claim 1, wherein at least one of said quantum dots is produced by a colloidal synthesis process.

9. The lighting device as claimed in claim 1, wherein at least one of the quantum dots emits in the far red 700-800 nm band.

10. A lighting method for plant cultivation, comprising:
illuminating light produced by a plurality of quantum dots of different sizes to at least one plant, the light being absorbable by photomorphogenetic receptors of the at least one plant to cause a photomorphogenetic effect in the at least one plant,
wherein the size distribution of said plurality of quantum dots produces an aggregate emission spectrum the same as the photosynthetically active radiation (PAR) spectrum, except that the emission spectrum omits or provides a very low intensity in the green yellow (500-600) nm band and comprises a high intensity spectral feature in the far red 700-800 nm band.

11. The lighting method as claimed in claim 10, wherein the quantum dots emit photons to the plants in a band or in various bands with preset relative intensities in the photon spectrum that cause the photomorphogenetic effect in the plants.

12. The lighting method as claimed in claim 10, wherein the photomorphogenetic effect is one or more of the following biological parameters: weight, leaf number, root mass, stem height, and chemical composition including one or more of vitamin, mineral, nutrient content, and nutrient concentration of the plant at different time points or at harvesting maturity.

13. The lighting method as claimed in claim 10, wherein at least one of said quantum dots is made of any of the following alloys: GaN, InGaN, AlGaN, GaAs cadmium selenide, cadmium sulphide, indium arsenide, indium phosphide and/or cadmium selenide sulphide or any combination thereof.

14. The lighting method as claimed in claim 10, wherein the size distribution of the quantum dots comprises quantum dots of different sizes within the range of 2 nm-200 nm.

15. The lighting method as claimed in claim 10, wherein at least one of said quantum dots is produced by colloidal synthesis.

16. The lighting method as claimed in claim 10, wherein the size of at least one of the quantum dots results in the quantum dot emitting in the far red 700-800 nm band.

17. A method for enhancing plant growth, comprising:
emitting light, by the at least one lighting device of claim 1, to at least one plant with the at least one plant in ambient light or in a dark cavity, said lighting device being the sole source of light.

18. The lighting as claimed in claim 1, wherein said lighting device is surrounded by a shading cavity which is configured to be closed with a lid.

* * * * *